United States Patent
Azmat et al.

(10) Patent No.: US 9,324,715 B2
(45) Date of Patent: Apr. 26, 2016

(54) FLIP-FLOP LAYOUT ARCHITECTURE IMPLEMENTATION FOR SEMICONDUCTOR DEVICE

(71) Applicant: Samsung Electronics Co., Ltd., Suwon-si (KR)

(72) Inventors: Raheel Azmat, Suwon-si (KR); Rwik Sengupta, Hwaseong-si (KR); Chulhong Park, Seongnam-si (KR); Kwanyoung Chun, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/504,075

(22) Filed: Oct. 1, 2014

(65) Prior Publication Data

US 2015/0179646 A1 Jun. 25, 2015

(30) Foreign Application Priority Data

Dec. 20, 2013 (KR) .......... 10-2013-0160347

(51) Int. Cl.
*H01L 27/092* (2006.01)
*H01L 27/02* (2006.01)
*H01L 21/8238* (2006.01)

(52) U.S. Cl.
CPC ...... *H01L 27/092* (2013.01); *H01L 21/823871* (2013.01); *H01L 27/0207* (2013.01); *H01L 21/823828* (2013.01)

(58) Field of Classification Search
CPC .......... H01L 27/0207; H01L 21/76816; H01L 23/5286; H01L 21/8238; H01L 23/528; H01L 27/11807; H01L 21/76897; H01L 21/823437; H01L 22/30; H01L 27/088; H01L 27/1156; H01L 27/2436; G11C 11/417; G11C 5/025; G06F 17/5068; G09G 2300/0809; G09G 2300/0857
See application file for complete search history.

(56) References Cited

U.S. PATENT DOCUMENTS

| | | | | |
|---|---|---|---|---|
| 4,816,706 A * | 3/1989 | Dhong | ............... | G11C 11/4091 327/212 |
| 5,068,603 A * | 11/1991 | Mahoney | ........... | G01R 31/2853 257/E23.151 |
| 5,264,385 A * | 11/1993 | Rodder | ................... | H01L 27/11 257/379 |
| 5,734,187 A * | 3/1998 | Bohr | ................... | H01L 27/1104 257/368 |
| 5,744,844 A * | 4/1998 | Higuchi | ............... | H01L 27/1104 257/368 |
| 5,852,572 A * | 12/1998 | Jung | ..................... | G11C 11/412 365/154 |
| 6,038,164 A | 3/2000 | Schulz et al. | | |
| 6,166,560 A * | 12/2000 | Ogura | ............... | H01L 27/11807 257/206 |
| 7,038,925 B1 * | 5/2006 | Ohbayashi | ........... | G11C 11/419 365/154 |
| 7,075,157 B2 | 7/2006 | Kikushima et al. | | |
| 7,176,078 B2 | 2/2007 | Kim | | |
| 7,687,862 B2 * | 3/2010 | Huebinger | ........ | H01L 21/76224 257/331 |
| 8,188,549 B2 | 5/2012 | Ishii | | |
| 8,243,501 B2 | 8/2012 | Ouchi et al. | | |
| 2008/0042218 A1 | 2/2008 | Igarashi et al. | | |
| 2011/0195564 A1 * | 8/2011 | Liaw | ..................... | G11C 11/412 438/585 |
| 2012/0280331 A1 | 11/2012 | Ou et al. | | |

* cited by examiner

*Primary Examiner* — Evan Pert
*Assistant Examiner* — Gustavo Ramallo
(74) *Attorney, Agent, or Firm* — Muir Patent Law, PLLC

(57) ABSTRACT

A semiconductor device includes a substrate including PMOSFET and NMOSFET regions. First and second gate electrodes are provided on the PMOSFET region, and third and fourth gate electrodes are provided on the NMOSFET region. A connection contact is provided to connect the second gate electrode with the third gate electrode, and a connection line is provided on the connection contact to cross the connection contact and connect the first gate electrode to the fourth gate electrode.

20 Claims, 14 Drawing Sheets

US 9,324,715 B2

FLIP-FLOP LAYOUT ARCHITECTURE IMPLEMENTATION FOR SEMICONDUCTOR DEVICE

CROSS-REFERENCE TO RELATED APPLICATIONS

This U.S. non-provisional patent application claims priority under 35 U.S.C. §119 to Korean Patent Application No. 10-2013-0160347, filed on Dec. 20, 2013, in the Korean Intellectual Property Office, the entire contents of which are hereby incorporated by reference.

BACKGROUND

1. Field

Aspects of the present disclosure relate to a semiconductor device, and in particular, to a semiconductor device with a flip-flop circuit.

2. Description of the Related Art

Semiconductor devices are increasingly being used in consumer, commercial and other electronic devices. Semiconductor devices may be classified as memory devices for storing data, logic devices for processing data, and hybrid devices including both of memory and logic elements. Due to the increased demand for electronic devices with fast speed and/or low power consumption, these semiconductor devices are used to provide high reliability, high performance, and/or multiple functions. To satisfy these technical requirements, complexity and/or integration density of semiconductor devices are being increased.

SUMMARY

An aspect of the present inventive concepts provides a highly-integrated semiconductor device, in which cells having a reduced height are provided.

In one example embodiment of the inventive concept, a semiconductor device may include a substrate including a PMOSFET region and an NMOSFET region, a first and a second gate electrode in the PMOSFET region, a third and a fourth gate electrode in the NMOSFET region, a connection contact connecting the second gate electrode and the third gate electrode, and a connection line connecting the first gate electrode and the fourth gate electrode, the connection line crossing over the connection contact.

In some embodiments, an extending line of the first gate electrode may be aligned with the third gate electrode, and an extending line of the second gate electrode may be aligned with the fourth gate electrode, when viewed in a plan view.

In some embodiments, the semiconductor device may further include a device isolation layer between the PMOSFET region and the NMOSFET region. The connection line crosses over the connection contact on the device isolation layer.

In some embodiments, the connection contact may be electrically connected with upper surfaces of the second and third gate electrodes.

In some embodiments, the semiconductor device may further include via-holes between the connection line and the first gate electrode and between the connection line and the fourth gate electrode, respectively.

In some embodiments, the semiconductor device may further include a fifth gate electrode extending from the PMOSFET region to the NMOSFET region, and a gate contact in contact with an upper surface of the fifth gate electrode. The gate contact comprises a portion crossing a sidewall of the fifth gate electrode, when viewed in a plan view.

In some embodiments, the semiconductor device may further include a sixth gate electrode and a seventh gate electrode on the PMOSFET and NMOSFET regions, respectively, a first skip contact in contact with an upper surface of the sixth gate electrode, and a second skip contact in contact with an upper surface of the seventh gate electrode. An extending line of the sixth gate electrode may be aligned with the seventh gate electrode, when viewed in a plan view, the first skip contact may be connected in common to source/drain regions provided at both sides, respectively, of the sixth gate electrode, and the second skip contact may be connected in common to source/drain regions provided at both sides, respectively, of the seventh gate electrode.

In some embodiments, the first and second skip contacts may be connected to the source/drain regions through connection conductive patterns.

In another example embodiment of the inventive concept, a semiconductor device may include a flip-flop circuit. The flip-flop circuit may include first and fourth gate electrodes, which may be provided on the PMOSFET and NMOSFET regions, respectively, and to which a scan enable inversion signal may be applied, second and third gate electrodes, which are provided on the PMOSFET and NMOSFET regions, respectively, and to which a scan enable signal may be applied, and a first cross coupled structure connecting the second gate electrode to the third gate electrode and connecting the first gate electrode to the fourth gate electrode. The first cross coupled structure may comprise a first connection contact connecting the first gate electrode to the fourth gate electrode, and a first connection line connecting the second gate electrode to the third gate electrode and crossing the connection contact, the first connection line crossing over the first connection contact. An extending line of the first gate electrode may be aligned with the third gate electrode, and an extending line of the second gate electrode may be aligned with the fourth gate electrode, when viewed in a plan view.

In some embodiments, the semiconductor device may further include a fifth gate electrode extending from the PMOSFET region to the NMOSFET region, and a gate contact in contact with a top surface of the fifth gate electrode, wherein the gate contact comprises a portion crossing a sidewall of the fifth gate electrode, when viewed in a plan view.

In some embodiments, the first connection contact and the gate contact may be provided at substantially the same level from the substrate.

In some embodiments, the semiconductor device may further include power rails crossing the first to fifth gate electrodes. The power rails and the first connection line may be provided at substantially the same level from the substrate.

In some embodiments, the semiconductor device may further include a second cross coupled structure spaced apart from the first cross coupled structure.

In some embodiments, the second cross coupled structure may include sixth and ninth gate electrodes, which are provided on the PMOSFET and NMOSFET regions, respectively, and to which a clock signal may be applied, seventh and eighth gate electrodes, which are provided on the PMOSFET and NMOSFET regions, respectively, and to which a clock inversion signal may be applied, a second connection contact connecting the sixth gate electrode to the ninth gate electrode, and a second connection line connecting the seventh gate electrode to the eighth gate electrode and crossing over the second connection contact. An extending line of the sixth gate electrode may be aligned with the eighth gate electrode, and an extending line of the seventh gate electrode may be aligned with the ninth gate electrode, when viewed in a plan view.

In some embodiments, the semiconductor device may further include a device isolation layer between the PMOSFET and NMOSFET regions. The first connection line may cross over the first connection contact on the device isolation layer.

In still another example embodiment of the inventive concept, a semiconductor device may include a substrate including a PMOSFET region and an NMOSFET region, a first and a second gate electrode in the PMOSFET region, a third and a fourth gate electrode in the NMOSFET region, a device isolation layer between the PMOSFET and NMOSFET regions, a connection contact connecting the second gate electrode and the third gate electrode, a connection line connecting the first gate electrode and the fourth gate electrode, the connection line crossing over the connection contact on the device isolation layer, a fifth gate electrode extending from the PMOSFET region to the NMOSFET region, the fifth gate electrode crossing over the device isolation layer, and a gate contact in contact with an upper surface of the fifth gate electrode, the gate contact being over the device isolation layer.

In some embodiments, an extending line of the first gate electrode may be aligned with the third gate electrode, and an extending line of the second gate electrode may be aligned with the fourth gate electrode, when viewed in a plan view.

In some embodiments, the semiconductor device may further include via-holes between the connection line and the first gate electrode and between the connection line and the fourth gate electrode, respectively.

In some embodiments, the semiconductor device may further include a sixth gate electrode and a seventh gate electrode on the PMOSFET and NMOSFET regions, respectively, a first skip contact in contact with an upper surface of the sixth gate electrode, and a second skip contact in contact with an upper surface of the seventh gate electrode. An extending line of the sixth gate electrode may be aligned with the seventh gate electrode, when viewed in a plan view,

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
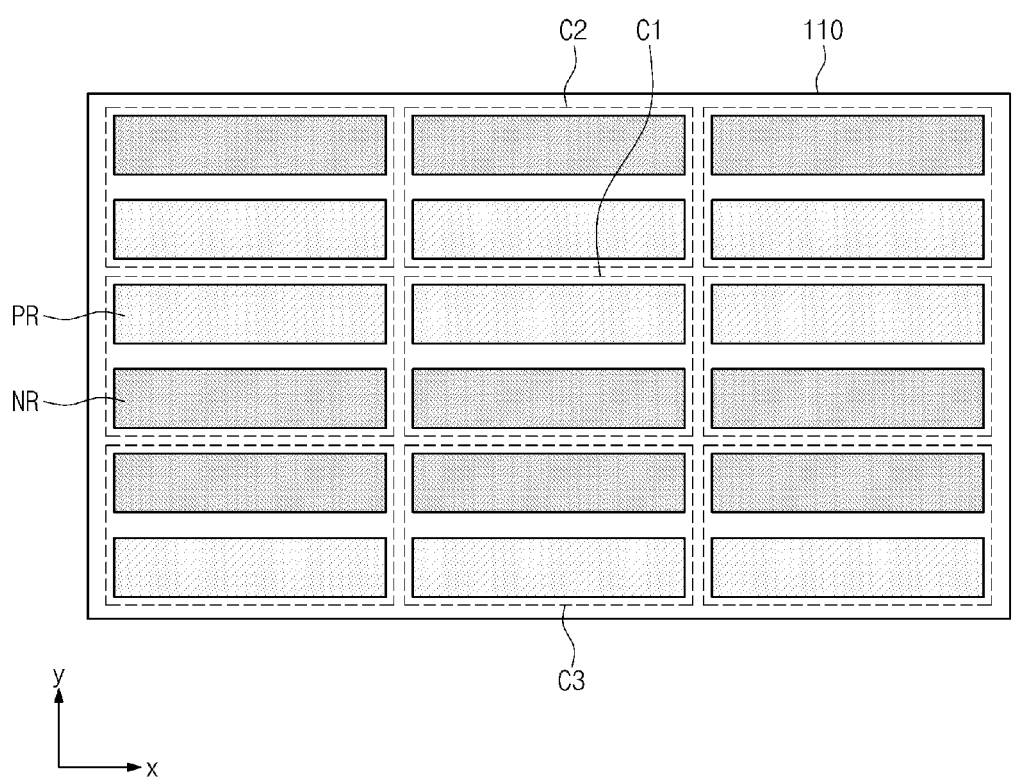
FIG. 1 is a plan view of a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements or layers should be interpreted in a like fashion (e.g., "between" versus "directly between," "adjacent" versus "directly adjacent," "on" versus "directly on").

Also, it will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. As used herein the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The terms "substantially" and/or "about" may be used herein to reflect this meaning Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
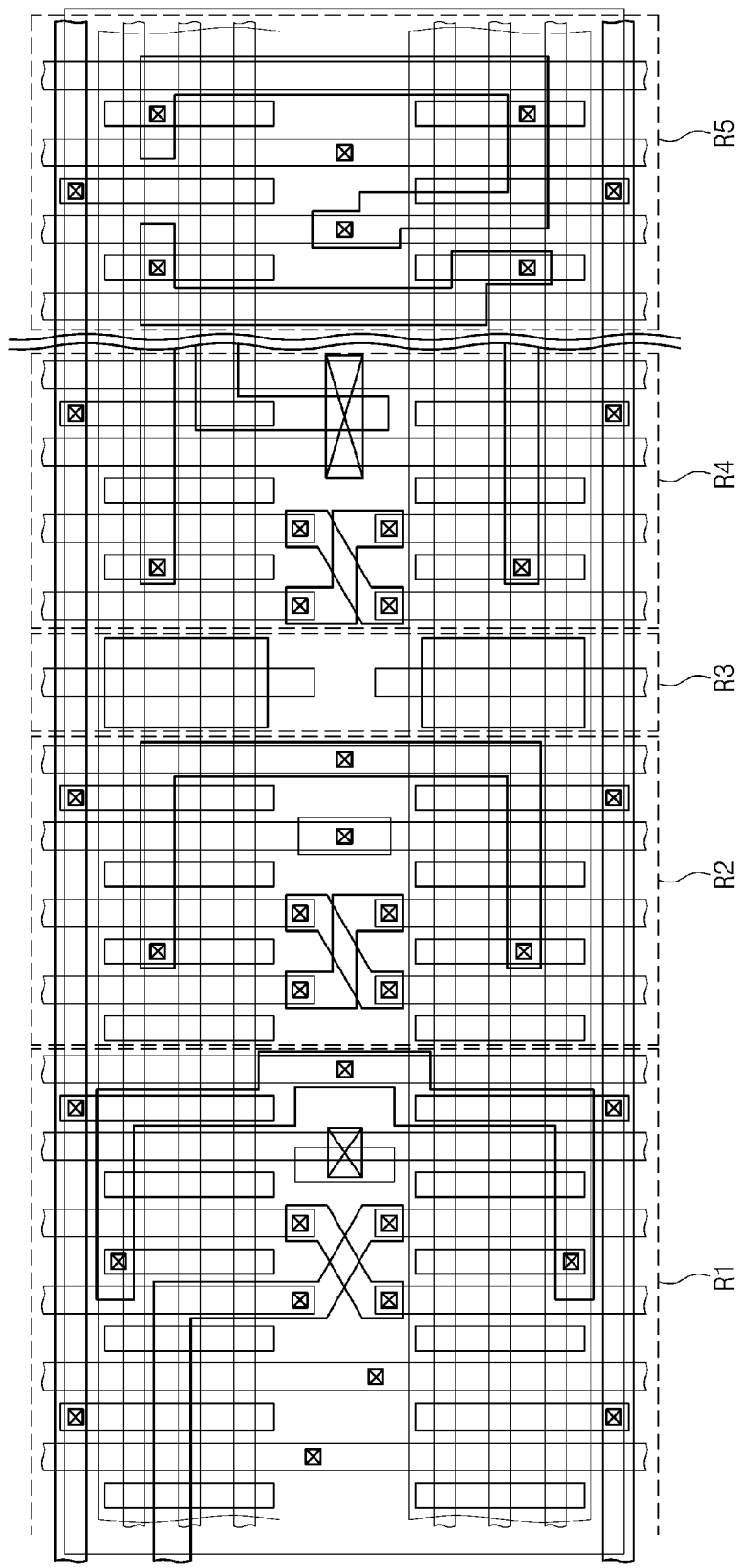
FIG. 2 is an enlarged plan view illustrating the first cell C1 of FIG. 1, according to one example embodiment.

FIG. 1 is a plan view of a semiconductor device according to example embodiments of the inventive concept. FIG. 2 is an enlarged plan view illustrating the first cell C1 of FIG. 1. As used herein, a semiconductor device may refer to any of the various devices such as shown in FIGS. 1-18, and may also refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Referring to FIGS. 1 and 2, a semiconductor device may include a plurality of logic cells. Each of the logic cells may include a plurality of transistors. For example, the semiconductor device may include a first logic cell C1 and second and third logic cells C2 and C3 spaced apart from each other in a y direction by the first logic cell C1 interposed therebetween. Each of the logic cells may include active regions that are delimited by a device isolation layer 110. For example, each of the logic cells may include a PMOSFET region PR and an NMOSFET region NR. In each logic cell, the PMOSFET and NMOSFET regions PR and NR may be separated from each other by the device isolation layer 110. In the description below, a logic cell may refer to a unit configured to perform a logical operation, and the first logic cell C1 will be described as an example of such a logic cell. However, other logic cells in the semiconductor device may have substantially the same or similar structure as that of the first logic cell C1. Further, the number of the logic cells may be variously changed from that illustrated in the drawing.

In certain embodiments, the first logic cell C1 may include first to fifth regions R1-R5. The first to fourth regions R1-R4 may constitute a flip-flop circuit, and the fifth region R5 may include a clock circuit, which is connected to the flip-flop circuit, and to which an external clock signal CK is input. In detail, a core circuit with scan and flip-flop functions may be provided in the first region R1, and the second and fourth regions R2 and R4 may be buffer regions. A circuit with skip and/or jumper functions may be provided in the third region R3.

Hereinafter, the first to fifth regions R1-R5 will be described in more detail.

Figure 3:
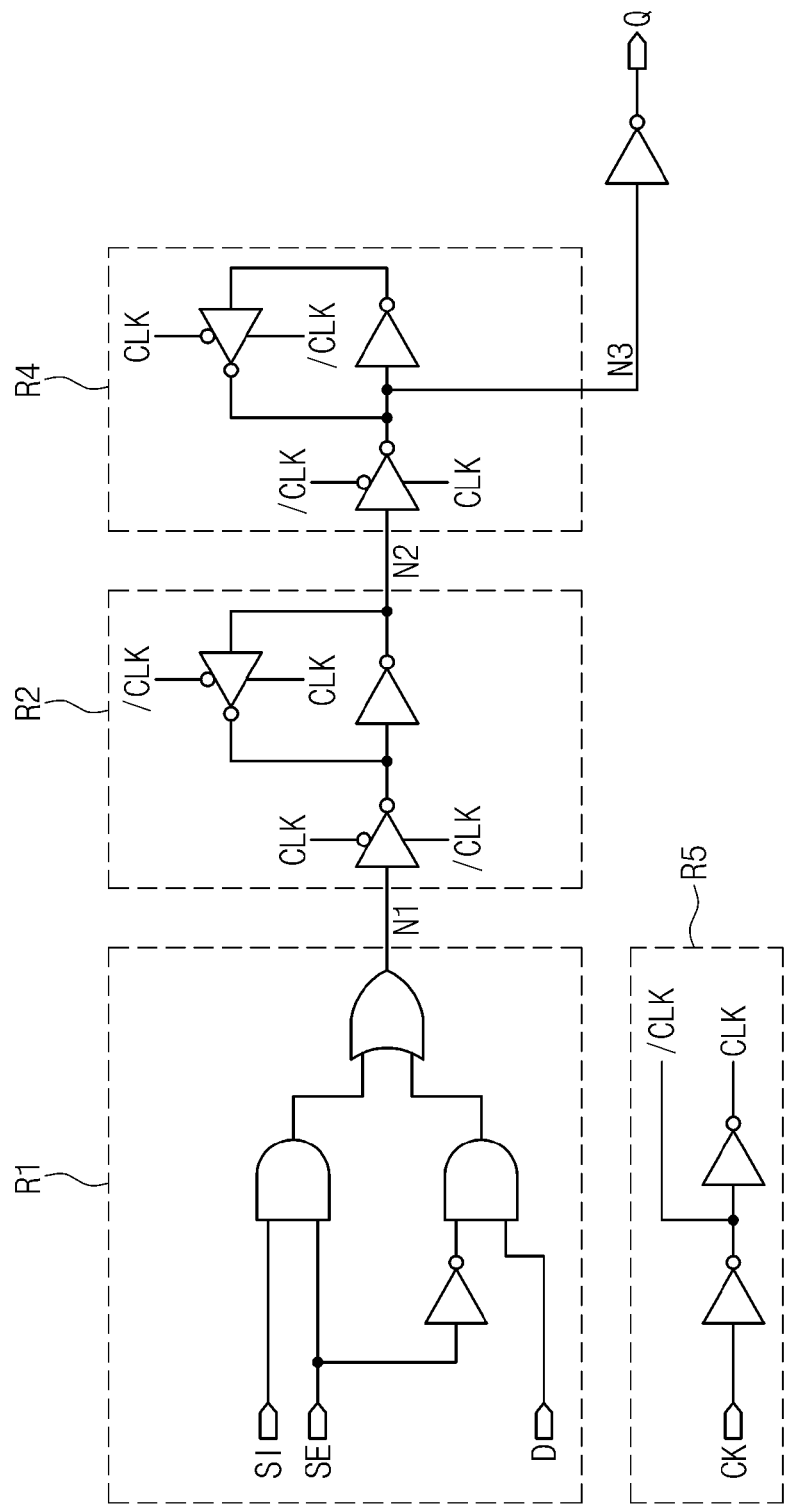
FIG. 3 is a logic circuit diagram of a flip-flop circuit of FIG. 2, according to one example embodiment.
Figure 4:
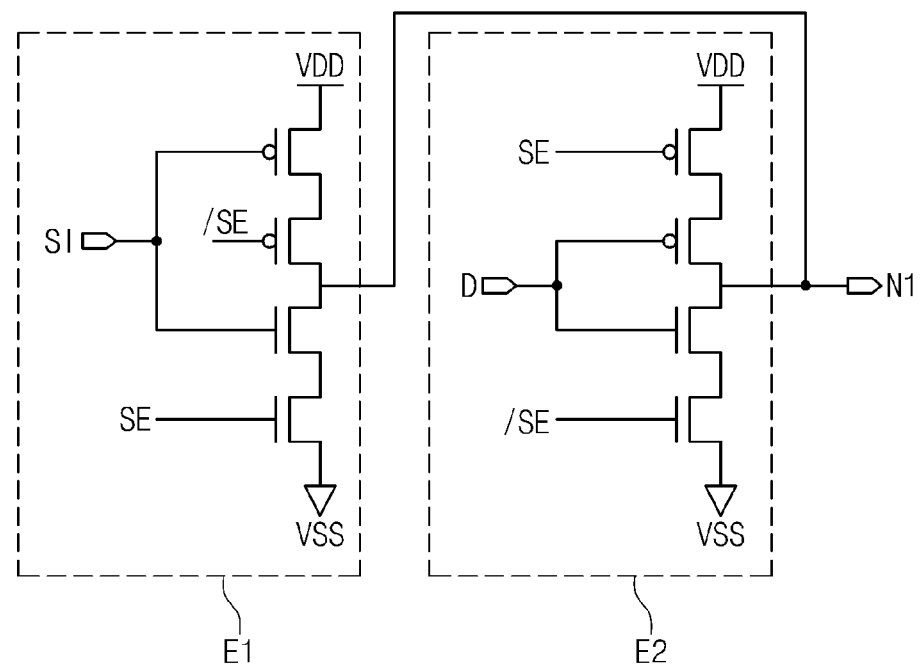
FIG. 4 is an equivalent circuit diagram of the first region R1 of FIG. 3, according to one example embodiment.
Figure 5:
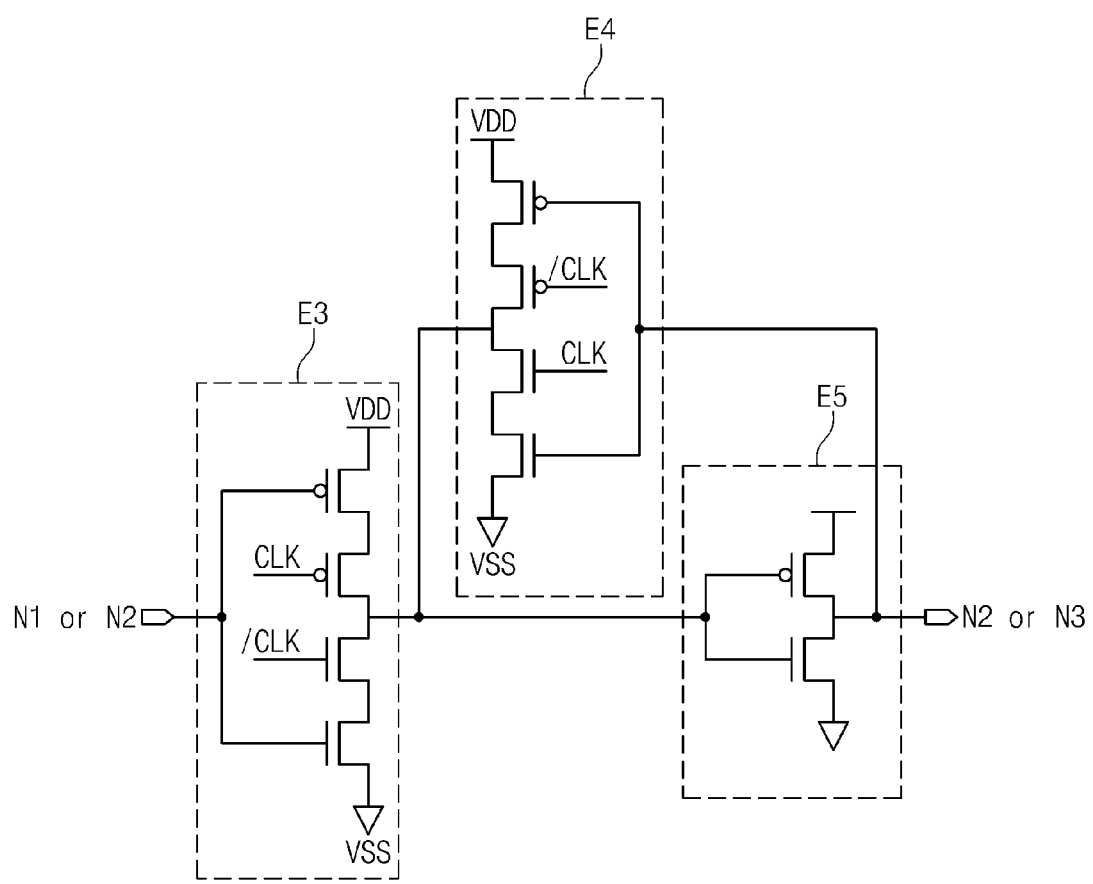
FIG. 5 is an equivalent circuit diagram of the second or fourth region R2 or R4 of FIG. 3, according to one example embodiment.

FIG. 3 is a logic circuit diagram of a flip-flop circuit of FIG. 2. FIG. 4 is an equivalent circuit diagram of the first region R1 of FIG. 3. FIG. 5 is an equivalent circuit diagram of the second or fourth region R2 or R4 of FIG. 3.

Referring to FIGS. 3 and 4, the first region R1 may include first and second elements E1 and E2, to which a scan input signal SI and an external input signal D, respectively, are input. The first element E1 may include four transistors (for example, first to fourth transistors), which are sequentially connected in series between VDD and VSS terminals. In the first element E1, the first and second transistors adjacent to the VDD terminal may be PMOS transistors, and the third and fourth transistors adjacent to the VSS terminal may be NMOS transistors. In the first element E1, the scan input signal SI may be input to the first and third transistors, a scan enable inversion signal /SE may be input to the second transistor, and the scan enable signal SE may be input to the fourth transistor. The second element E2 may include four transistors (for example, first to fourth transistors), which are sequentially connected in series between the VDD and VSS terminals. In the second element E2, the first and second transistors adjacent to the VDD terminal may be PMOS transistors, and the third and fourth transistors adjacent to the VSS terminal may be NMOS transistors. In the second element E2, the external input signal D may be input to the second and third transistors, and the scan enable signal SE may be input to the first transistor, and the scan enable inversion signal /SE may be input to the fourth transistor.

The first and second elements E1 and E2 may be connected in parallel to a first node N1.

Referring to FIGS. 3 and 5, the second region R2 may include a third element E3, a fourth element E4, and a fifth element E5 that are provided between the first node N1 and a second node N2. A clock signal CLK and a clock inversion signal /CLK may be input to each of the third and fourth elements E3 and E4. The fourth region R4 may be configured to include elements that are the same as the third to fifth elements E3-E5. For example, the fourth region R4 may be configured to have substantially the same configuration as that of the second region R2, except that it is provided between the second node N2 and a third node N3. In other words, the following description of the second region R2 can be equivalently applied to the fourth region R4.

The fourth element E4 and the fifth element E5 may be connected in parallel between the third element E3 and the second node N2. The third element E3 may include four transistors (for example, first to fourth transistors), which are sequentially connected in series between VDD and VSS terminals. In the third element E3, the first and second transistors adjacent to the VDD terminal may be PMOS transistors, and the third and fourth transistors adjacent to the VSS terminal may be NMOS transistors. A signal from the first node N1 may be input to the first and fourth transistors. The clock signal CLK may be input to the second transistor, and the clock inversion signal /CLK may be input to the third transistor.

The fourth element E4 may include four transistors (for example, first to fourth transistors), which are sequentially connected in series between the VDD and VSS terminals. In the fourth element E4, the first and second transistors adjacent to the VDD terminal may be PMOS transistors, and the third and fourth transistors adjacent to the VSS terminal may be NMOS transistors. The first and fourth transistors may be connected to the second node N2. The second transistor may be input with the clock inversion signal /CLK, and the third transistor may be input with the clock signal CLK.

The following is a timing table of the flip-flop circuit according to example embodiments of the inventive concept.

| D[n] | SI | SE | CK | Q[n + 1] |
|------|----|----|-----|---------|
| 1 | X | 0 | Low→High | 1 |
| 0 | X | 0 | Low→High | 0 |
| X | X | X | High→Low | Q[n] |
| X | 1 | 1 | Low→High | 1 |
| X | 0 | 1 | Low→High | 0 |

When an external input D[n] is at a logic high state and a scan enable signal SE is at an inactive state, an external output Q[n+1] may go to a logic high state during transition of the external clock CK from a low state to a high state. When the external input D[n] is at a logic low state and the scan enable signal SE is at an inactive state, the external output Q[n+1] may go to a logic low state during transition of the external clock CK from the low state to the high state. When all of the external input D[n], the scan enable signal SE, and the scan input signal SI are absent, logic level of the external output Q[n+1] may be maintained to its previous logic level, i.e., Q[n], during transition of the external clock CK from the high state to the low state. When the external input D[n] is absent and the scan enable signal SE and the scan input signal SI are at an active state, the external output Q[n+1] may go to a logic high state during transition of the external clock CK from a low state to a high state. When the external input D[n] is absent, the scan enable signal SE is at an active state, and the scan input signal SI is at an inactive state, the external output Q[n+1] may go to a logic low during transition of the external clock CK from a low state to a high state.

Hereinafter, the first region R1 will be described in more detail.

Figure 6:
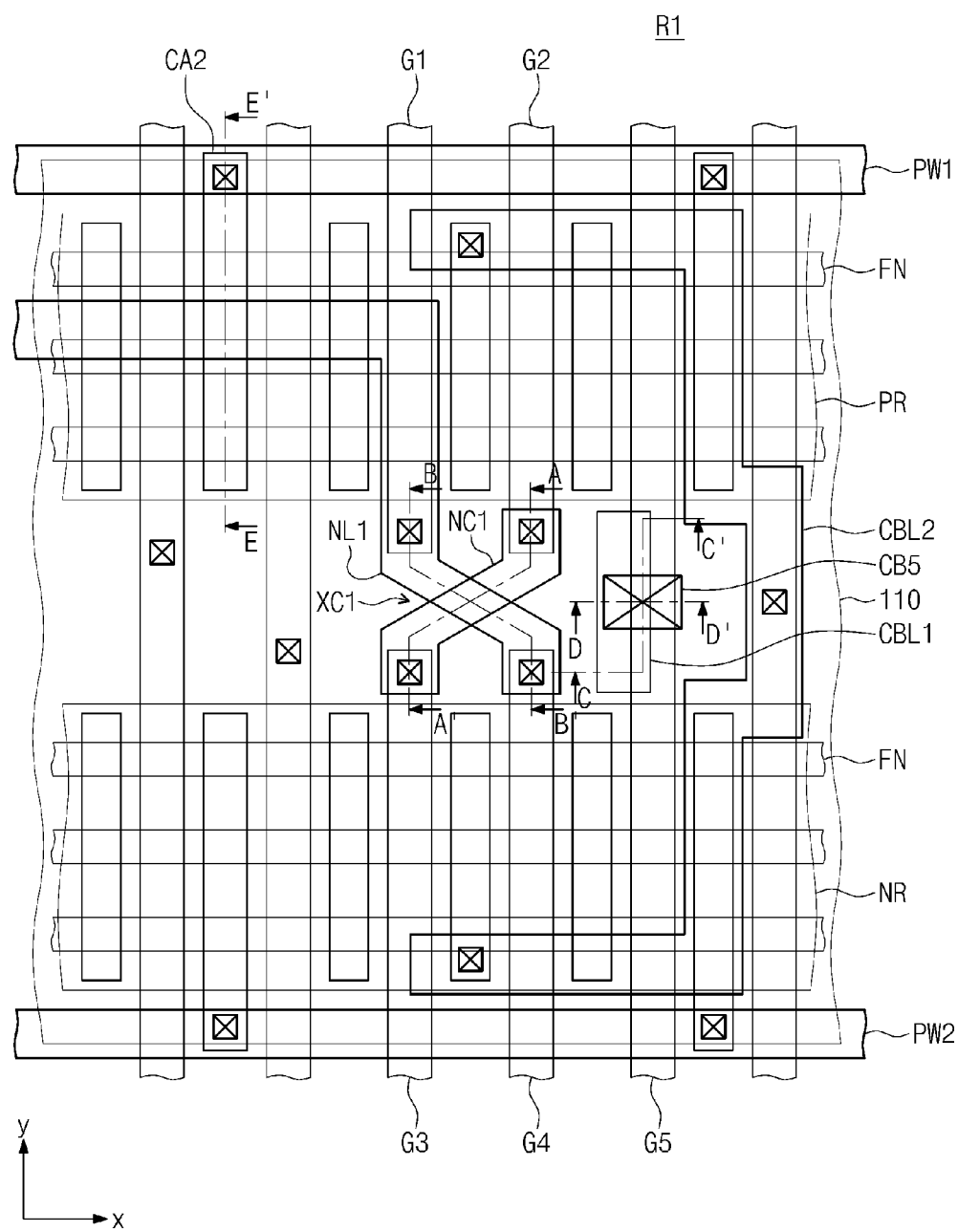
FIG. 6 is a plan view of the first region R1 of FIGS. 2 and 3, according to one example embodiment.

FIG. 6 is a plan view of the first region R1 of FIGS. 2 and 3, and FIGS. 7 through 11 are sectional views taken along lines A-A', B-B', C-C', D-D', and E-E', respectively, of FIG. 6.

Figure 7:
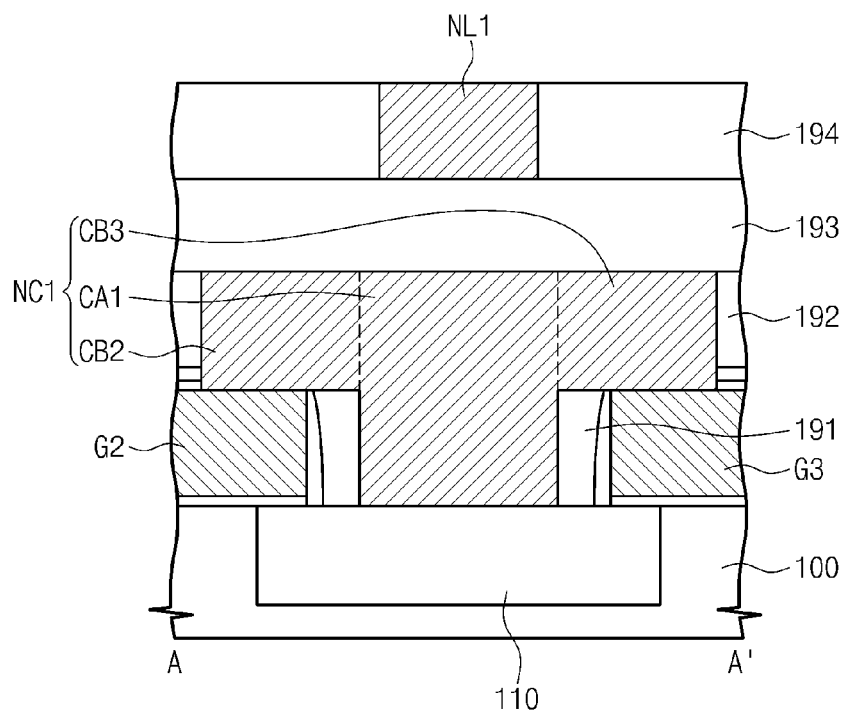
FIGS. 7 through 11 are sectional views taken along lines A-A', B-B', C-C', D-D', and E-E', respectively, of FIG. 6, according to certain example embodiments.
Figure 8:
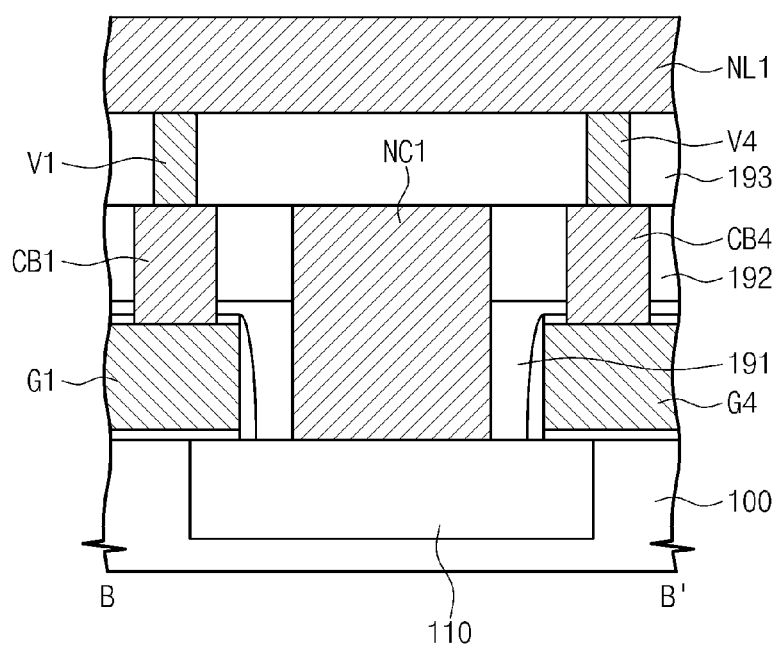

Referring to FIGS. 6 through 8, a first device isolation layer 110 may be provided on a substrate 100 to define a PMOS-FET region PR and an NMOSFET region NR. The substrate 100 may be, for example, a silicon wafer, a germanium wafer, or a silicon-on-insulator (SOI) wafer. The PMOSFET and NMOSFET regions PR and NR may be spaced apart from each other in the y direction by the first device isolation layer 110. Although each of the PMOSFET and NMOSFET regions PR and NR is shown to be a single region, it may be configured to include a plurality of regions divided by the first device isolation layer 110.

Gate electrodes G1-G5 may be provided on the substrate 100 to extend along the y direction. The gate electrodes G1-G5 may be provided in a first interlayered insulating layer 191. In example embodiments, first to fourth gate electrodes G1-G4 may be provided on the NMOSFET region NR or the PMOSFET region PR. As an example, the first and second gate electrodes G1 and G2 may be provided on the PMOSFET region PR, and the third and fourth gate electrodes G3 and G4 may be provided on the NMOSFET region NR. The first gate electrode G1 may be provided in such a way that a line extending from the first gate electrode G1 in the direction thereof (e.g., an extending line of the first gate electrode G1) is in an extending direction of the third gate electrode G3, i.e, parallel to the y direction, and the second gate electrode G2 may be provided in such a way that a line extending from the second gate electrode G2 in the direction thereof (e.g., an extending line of the second gate electrode G2) is in an extending direction of the fourth gate electrode G4, i.e, parallel to the y direction. In certain embodiments, the first and third gate electrodes G1 and G3 may be formed by patterning a conductive line extending in the y direction, and the second and fourth gate electrodes G2 and G4 may be formed by patterning another conductive line extending in the y direction.

The first gate electrode G1 may be a gate electrode of a transistor, to which the scan enable inversion signal /SE of the first element E1 described with reference to FIGS. 3 and 4 is applied. The fourth gate electrode G4 may be a gate electrode of a transistor, to which the scan enable inversion signal /SE of the second element E2 is applied. The second gate electrode G2 may be a gate electrode of a transistor, to which the scan enable signal SE of the first element E1 is applied. The third gate electrode G3 may be a gate electrode of a transistor, to which the scan enable signal SE of the second element E2 is applied.

The fifth gate electrode G5 may cross the PMOSFET and NMOSFET regions PR and NR in the y direction. Gate insulating layers may be provided under the gate electrodes G1-G5, and capping layers may be provided on the gate electrodes G1-G5, respectively. Each of the gate insulating layers may include at least one of a silicon oxide layer, a silicon oxynitride layer, or a high-k dielectric, whose dielectric constant is higher than that of the silicon oxide layer. The gate electrodes G1-G5 may include at least one of doped semiconductors, metals, and conductive metal nitrides. The capping layers may include at least one of a silicon oxide layer, a silicon nitride layer, and a silicon oxynitride layer. Insulating spacers may be provided on sidewalls of the gate electrodes G1-G5, respectively.

A first cross coupled structure XC1 may be provided on the first region R1. The first cross coupled structure XC1 may be configured to connect the first gate electrode G1 to the fourth gate electrode G4 and connect the second gate electrode G2 to the third gate electrode G3. The first cross coupled structure XC1 may be provided, for example, between the PMOSFET and NMOSFET regions PR and NR, e.g., on the first device isolation layer 110.

The first cross coupled structure XC1 may include a first connection contact NC1 connecting the second gate electrode G2 to the third gate electrode G3. The first connection contact NC1 may be configured and positioned to be able to apply the scan enable signal SE to both of the second and third gate electrodes G2 and G3. The first connection contact NC1 may include a first active contact CA1 provided on the first device isolation layer 110 and second and third gate contacts CB2 and CB3 extending laterally from the first active contact CA1 to cover at least partially top surfaces of the second gate electrode G2 and the third gate electrode G3. The second gate contact CB2 may be in contact with and electrically connected to the top surface of the second gate electrode G2. The third gate contact CB3 may be in contact with, and electrically connected to, the top surface of the third gate electrode G3.

In certain embodiments, the first active contact CA1 and the second and third gate contacts CB2 and CB3 may be provided in the form of a single conductive element, in which an interface region is not formed. For example, a first contact hole, in which the first active contact CA1 is formed, may be separately formed using an etching process different from that for forming second contact holes, in which the second and third gate contacts CB2 and CB3 are formed, and the first connection contact NC1 may be formed by filling the first and second contact holes with a conductive material. The first connection contact NC1 may be formed of at least one of metals, conductive metal nitrides, or doped semiconductors. For example, the first connection contact NC1 may include tungsten, titanium, tantalum, and/or nitrides thereof.

The first cross coupled structure XC1 may include a first connection line NL1 connecting the first gate electrode G1 to the fourth gate electrode G4. The first connection line NL1 may be configured and positioned to be able to apply the scan enable inversion signal /SE to both of the first and fourth gate electrodes G1 and G4. The first connection line NL1 may be provided on the first connection contact NC1 to cross the first connection contact NC1 (e.g., the first connection line NL1 may cross over the first connection contact NC1). The first connection line NL1 and the first connection contact NC1 may be provided over the first device isolation layer 110 to intersect to each other.

The first connection line NL1 may be electrically connected to the first gate electrode G1 via a first via hole V1 and a first gate contact CB1 and may be electrically connected to the fourth gate electrode G4 via a fourth via hole V4 and a fourth gate contact CB4. The first and fourth gate contacts CB1 and CB4 may be provided in the second interlayered insulating layer 192, and the first and fourth via holes V1 and V4 may be provided in a third interlayered insulating layer 193 on the second interlayered insulating layer 192.

The first connection line NL1 may be disposed in a fourth interlayered insulating layer 194. The first and fourth via holes V1 and V4 and the first and fourth gate contacts CB1 and CB4 may include at least one of metals, conductive metal nitrides, or doped semiconductor materials. In example embodiments, the first and fourth via holes V1 and V4 and the first and fourth gate contacts CB1 and CB4 may be formed using a chemical vapor deposition process and/or a sputtering process. At least one of the first to the fourth interlayered insulating layers 191-194 may include silicon oxide.

The first cross coupled structure XC1 makes it possible to increase an integration density of a semiconductor device including a flip-flop circuit according to example embodiments of the inventive concept. As described above, the flip-flop circuit may include the second and third gate electrodes G2 and G3, which are provided on the PMOSFET and NMOSFET regions PR and NR, respectively, and to which the scan enable signal SE is applied. Further, the flip-flop circuit may include the first and fourth gate electrodes G1 and G4, which are provided on the PMOSFET and NMOSFET regions PR and NR, respectively, and to which the scan enable inversion signal /SE is applied. In the meantime, electric connections between the first and fourth gate electrodes G1 and G4 and between the second and third gate electrodes G2 and G3 may be achieved by a way of forming the first and fourth gate electrodes G1 and G4 to have a structure of the physically-connected single electrode, forming the second and third gate electrodes G2 and G3 at both sides, respectively, of the single electrode, then connecting the second and third gate electrodes G2 and G3 to each other. But since three conductive lines are needed, in total, for this way, such a semiconductor device suffers from an increase in width in x direction.

By contrast, according to example embodiments of the inventive concept, the first cross coupled structure XC1 makes it possible to achieve the required electric connections using only two conductive lines. Accordingly, the semiconductor device can have an increased integration density. Further, according to the afore-described structure, a portion of the structure for connecting the gate electrodes is used for the contact plugs, and this makes it possible to achieve the desired electric connections between the gate electrodes, without an additional interconnection layer and a consequent increase in height of the cell.

Figure 9:
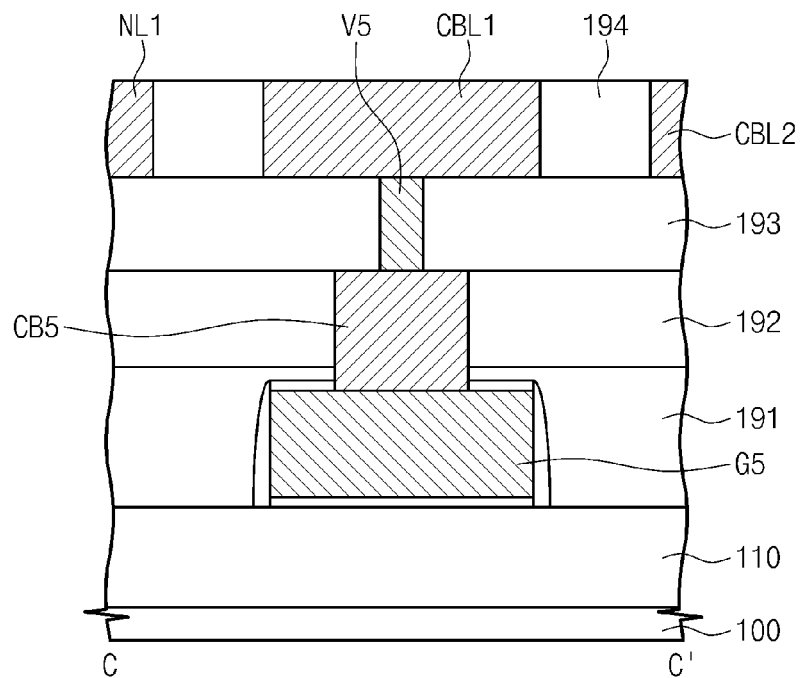
Figure 10:
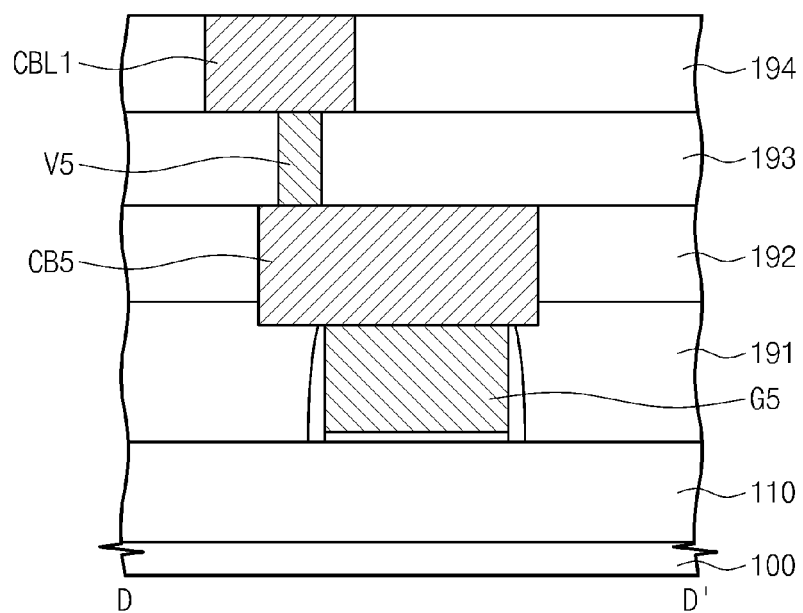

Referring to FIGS. 6, 9, and 10, a fifth gate contact CB5, a fifth via hole V5, and a first conductive line CBL1 may be sequentially provided on the fifth gate electrode G5. When viewed in a plan view, the fifth gate contact CB5 may include a portion crossing a sidewall of the fifth gate electrode G5. For example, the fifth gate contact CB5 may be shaped like a bar extending from the top surface of the fifth gate electrode G5 toward the x direction. In certain embodiments, when viewed in a plan view, the fifth via hole V5 may be provided not to be overlapped with the fifth gate electrode G5, and the first conductive line CBL1 may be offset from the fifth gate electrode G5.

Such a shape of the fifth gate contact CB5 makes it possible to prevent the first conductive line CBL1 from being electrically connected to lines adjacent thereto. For example, the first conductive line CBL1 may be provided between the first connection line NL1 and a second conductive line CBL2, and when viewed in a plan view, the second conductive line CBL2 may include a portion projecting toward the x direction. The first conductive line CBL1 may be offset from the fifth gate electrode G5, in consideration of the shape of the second conductive line CBL2 and a consequent disposition of the fifth gate contact CB5. As a result, it is possible to secure an effective distance between the first conductive line CBL1 and a neighboring line and thereby to prevent an electric short circuit from being formed therebetween.

Figure 11:
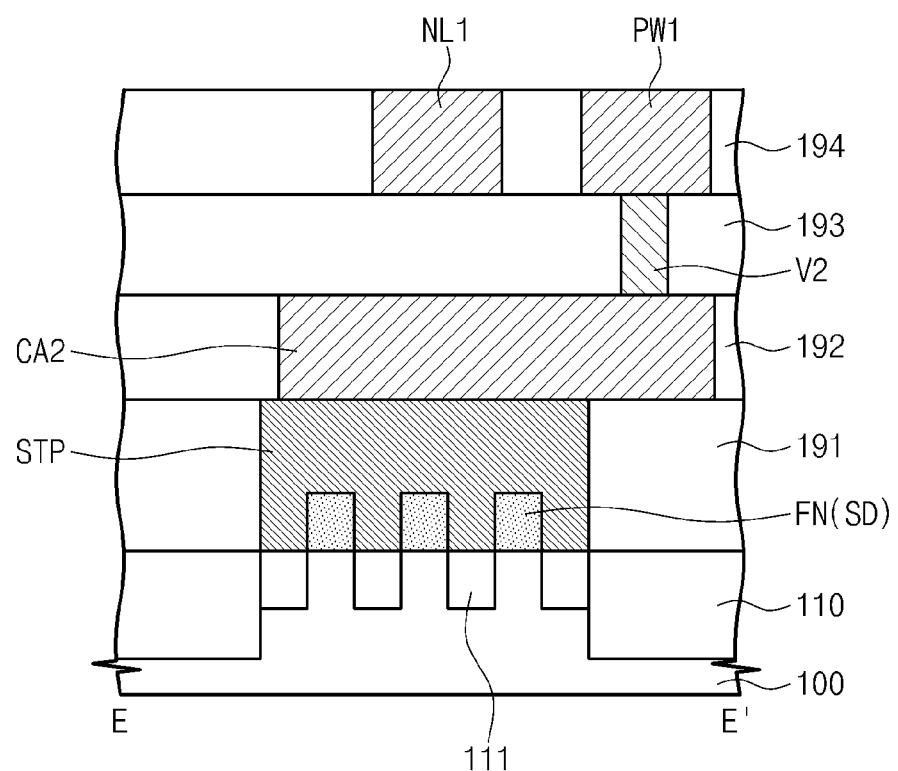

Referring to FIGS. 6 and 11, a plurality of active portions FN may be provided on each of the PMOSFET and NMOSFET regions PR and NR. As an example, each of the active portions FN may be provided between second device isolation layers 111 extending along the x direction and have a fin-shaped structure. The plurality of active portions FN may cross the gate electrodes G1-G5 and extend along the x direction.

In certain embodiments, as illustrated in FIG. 11, three active portions FN are formed on each of the PMOSFET and NMOSFET regions PR and NR, but example embodiments of the inventive concept not limited thereto. The first and second device isolation layers 110 and 111 may be a portion of a continuously-connected single insulating layer. In certain embodiments, the first device isolation layer 110 may be thicker than the second device isolation layers 111, and in this case, the second device isolation layers 111 may be separately formed using a process different from that for forming the first device isolation layer 110. In other example embodiments, the first and second device isolation layers 110 and 111 may be formed using the same process and thus they may have substantially the same thickness. The first and second device isolation layers 110 and 111 may be formed on the substrate 100. The first and second device isolation layers 110 and 111 may include, for example, a silicon oxide layer.

Source/drain regions SD may be formed in portions of the active portions FN that are not covered with the gate electrodes G1-G5. As shown in FIG. 11, the source/drain regions SD may be positioned in the active portions FN, but in certain embodiments, may extend toward a top of the substrate 100 or into a region between the second device isolation layers 111. The source/drain regions SD may be of p-type, in the PMOSFET region PR, and may be of n-type, in the NMOSFET region NR.

In the PMOSFET region PR, the source/drain regions SD may be electrically connected to each other by connection conductive patterns STP. For example, the connection conductive patterns STP may be formed to cover the active portions FN, thereby connecting the source/drain regions SD spaced apart from each other in the y direction. Each of the connection conductive patterns STP may be directly connected to the active portions FN. The connection conductive patterns STP may include a metal-silicide layer. For example, the connection conductive patterns STP may include at least one of titanium-silicide, tantalum-silicide, or tungsten-silicide. The connection conductive patterns STP may further include a metal layer, including at least one of titanium, tantalum, or tungsten. In certain embodiments, each of the connection conductive patterns STP may include a metal-silicide layer and a metal layer on the metal-silicide layer.

In the NMOSFET region NR, the source/drain regions SD may be connected to each other, in the same manner as those of the PMOSFET region PR, by the connection conductive patterns STP. For example, in the NMOSFET region NR, the source/drain regions SD spaced apart from each other in the y direction may be connected to each other by the connection conductive patterns STP. The connection conductive patterns STP may be provided in the first interlayered insulating layer 191.

The first logic cell C1 may include a first common conductive line PW1, which is provided between the PMOSFET region PR and the second logic cell C2 adjacent thereto in the y direction, and a second common conductive line PW2, which is provided between the NMOSFET region NR and the third logic cell C3 adjacent thereto in the y direction. In certain embodiments, the first common conductive line PW1 may be provided on the PMOSFET region PR to serve as a pathway for providing a drain voltage Vdd or a power voltage. The second common conductive line PW2 may be provided on the NMOSFET region NR to serve as a pathway for providing a source voltage Vss or a ground voltage.

The first and second common conductive lines PW1 and PW2 may extend parallel to the x direction and may be shared by logic cells adjacent to each other in the x direction. Further, the first common conductive line PW1 may be shared by the PMOSFET regions PR of the first and second logic cells C1 and C2, and the second common conductive line PW2 may be shared by the NMOSFET regions NR of the first and third logic cells C1 and C3.

A second active contact CA2 may be provided on the connection conductive pattern STP. The second active contact CA2 may extend along the connection conductive pattern STP. A second via hole V2 may be provided on the second active contact CA2. The source/drain regions SD may be electrically connected to the first common conductive line PW1 via hole the connection conductive patterns STP, the second active contact CA2 and the second via hole V2.

The first and second active contacts CA1 and CA2 may be formed using the same process and thus they may be positioned at substantially the same level from the substrate 100. The first and second common conductive lines PW1 and PW2 and the first connection line NL1 may be formed using the same process and thus they may be positioned at substantially the same level from the substrate 100. The second via hole V2 and the first, fourth, and fifth via holes V1, V4, and V5 may be formed using the same process and thus they may be positioned at substantially the same level from the substrate 100.

Figure 12:
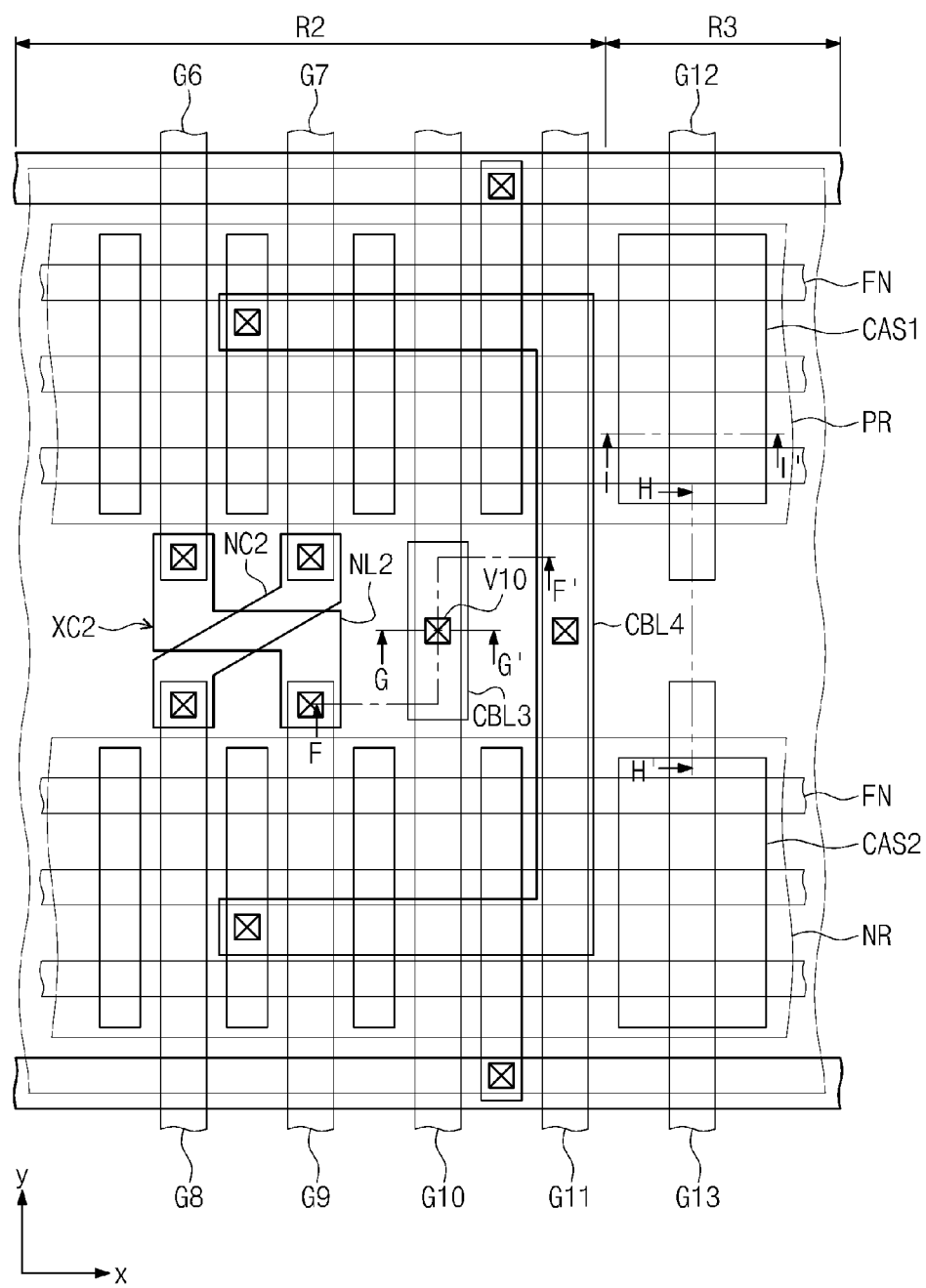
FIG. 12 is a plan view of the second and third regions R2 and R3 of FIGS. 2 and 3, according to one example embodiment.

FIG. 12 is a plan view of the second and third regions R2 and R3 of FIGS. 2 and 3, and FIGS. 13 through 16 are sectional views taken along lines F-F', G-G', H-H', and I-I', respectively, of FIG. 12.

Referring to FIG. 12, gate electrodes G6-G11 may be provided on the second region R2. The gate electrodes G6-G11 may include sixth to ninth gate electrodes G6-G9, which may be provided on the NMOSFET region NR or the PMOSFET region PR. As an example, the sixth and seventh gate electrodes G6 and G7 may be provided on the PMOSFET region PR, and the eighth and ninth gate electrodes G8 and G9 may be provided on the NMOSFET region NR. The sixth gate electrode G6 may be provided in such a way that a line extending from the sixth gate electrode G6 and in the direction thereof (e.g., an extending line of the sixth gate electrode G6) is in an extending direction of the eighth gate electrode G8, i.e, parallel to the y direction, and the seventh gate electrode G7 may be provided in such a way that a line extending from the seventh gate electrode G7 and in the direction thereof (e.g., an extending line of the seventh gate electrode G7) is in an extending direction of the ninth gate electrode G9, i.e, parallel to the y direction. In certain embodiments, the sixth and eighth gate electrodes G6 and G8 may be formed by patterning a conductive line extending in the y direction, and the seventh and ninth gate electrodes G7 and G9 may be formed by patterning another conductive line extending in the y direction.

In one embodiment, the sixth gate electrode G6 may be a gate electrode of a transistor, to which the clock signal CLK of the third element E3 described with reference to FIG. 3 and FIG. 5 is applied. The seventh gate electrode G7 may be a gate electrode of a transistor, to which the clock inversion signal /CLK of the fourth element E4 is applied. The eighth gate electrode G8 may be a gate electrode of a transistor, to which the clock inversion signal /CLK of the third element E3 is applied. The ninth gate electrode G9 may be a gate electrode of a transistor, to which the clock signal CLK of the fourth element E4 is applied.

The gate electrodes G6-G11 may further include tenth and eleventh gate electrodes G10 and G11, each of which extends parallel to the y direction and crosses the PMOSFET and NMOSFET regions PR and NR.

A second cross coupled structure XC2 may be provided on the second region R2. The second cross coupled structure XC2 may be configured to connect the sixth gate electrode G6 to the ninth gate electrode G9 and connect the seventh gate electrode G7 to the eighth gate electrode G8. The second cross coupled structure XC2 may be provided between the PMOSFET and NMOSFET regions PR and NR, e.g., on the first device isolation layer 110.

The second cross coupled structure XC2 may include a second connection contact NC2 connecting the seventh gate electrode G7 to the eighth gate electrode G8. The second connection contact NC2 may be configured and positioned to be able to apply the clock inversion signal /CLK to both of the seventh and eighth gate electrodes G7 and G8. The second cross coupled structure XC2 may include a second connection line NL2 connecting the sixth gate electrode G6 with the ninth gate electrode G9. The second connection line NL2 may be configured and positioned to be able to apply the clock signal CLK to both of the sixth and ninth gate electrodes G6 and G9. The second connection line NL2 may be provided on and across the second connection contact NC2. The second connection line NL2 and the second connection contact NC2 may cross each other on the first device isolation layer 110. The second connection contact NC2 may be concurrently formed with the first connection contact NC1 of FIG. 6, and the second connection line NL2 may be concurrently formed with the first connection line NL1 of FIG. 6.

The fourth region R4 of FIG. 2 may include a cross coupled structure (or a third cross coupled structure), which may be configured to have substantially the same structure as the second cross coupled structure XC2.

Figure 13:
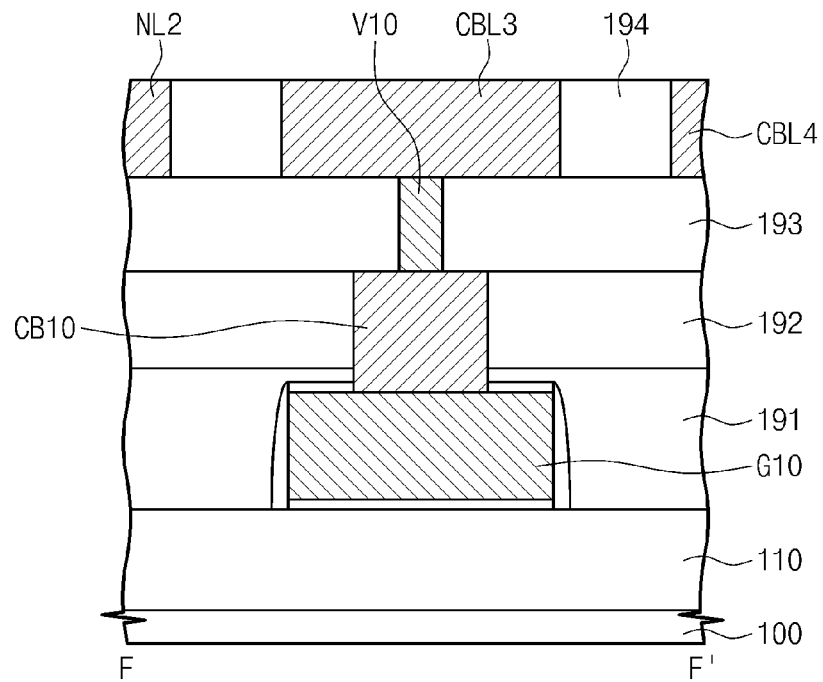
FIGS. 13 through 16 are sectional views taken along lines F-F', G-G', H-H', and I-I', respectively, of FIG. 12, according to certain example embodiments.
Figure 14:
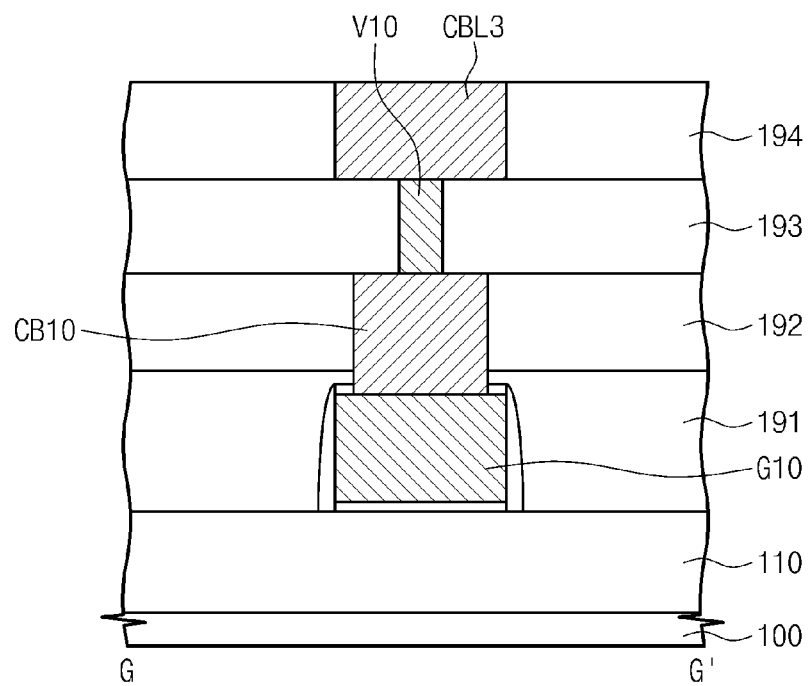

Referring to FIGS. 12 through 14, a tenth gate contact CB10, a tenth via hole V10, and a third conductive line CBL3 may be sequentially provided on the tenth gate electrode G10. When viewed in a plan view, the tenth gate contact CB10 may be provided not to cross a sidewall of the tenth gate electrode G10, unlike the fifth gate contact CB5 described with reference to FIGS. 6, 9, and 10. For example, all of sidewalls of the tenth gate contact CB10 may be positioned within a boundary of the tenth gate electrode G10. Such a difference in disposition or position between the tenth and fifth gate contacts CB10 and CB5 may result from a difference in distance from neighboring conductive lines therebetween. Accordingly, even when the third conductive line CBL3 is not disposed to be offset from the tenth gate electrode G10, the third conductive line CBL3 on the tenth gate contact CB10 may be substantially equidistant from the second connection line NL2 and a fourth conductive line CBL4.

Figure 15:
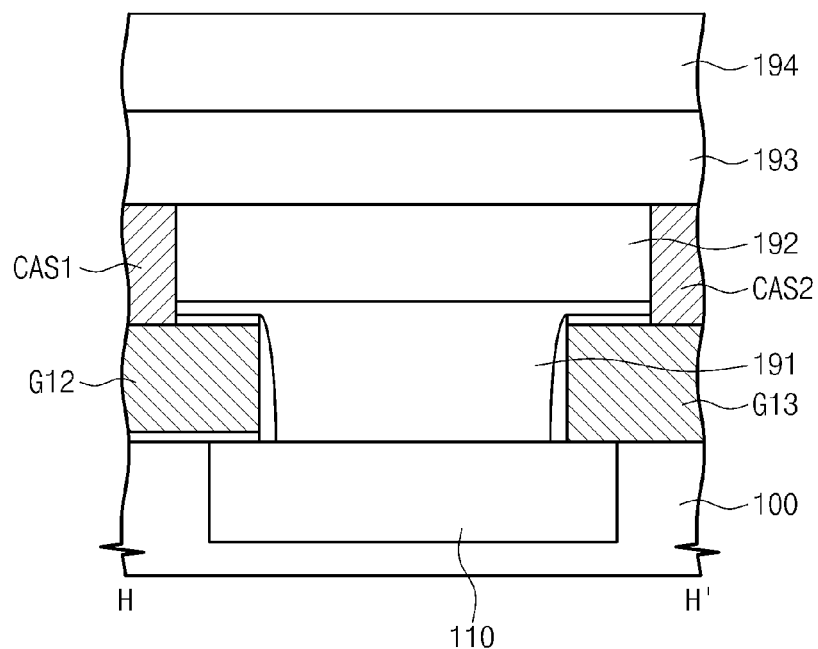
Figure 16:
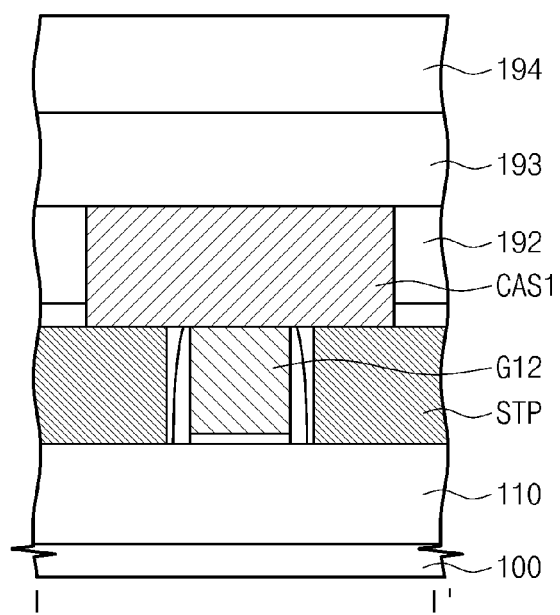

Referring to FIGS. 12, 15, and 16, twelfth and thirteenth gate electrodes G12 and G13 may be provided on the third region R3. The twelfth and thirteenth gate electrodes G12 and G13 may be spaced apart from each other in the y direction. Skip contacts CAS1 and CAS2 may be provided on the twelfth and thirteenth gate electrodes G12 and G13, respectively. The first skip contact CAS1 may be connected in common to not only a top surface of the twelfth gate electrode G12 but also top surfaces of connection conductive patterns STP provided at both sides of the twelfth gate electrode G12. Accordingly, the twelfth gate electrode G12 may be equipotential with source drain regions adjacent to the twelfth gate electrode G12. Similarly, the second skip contact CAS2 may be connected in common to not only a top surface of the thirteenth gate electrode G13 but also top surfaces of connection conductive patterns STP provided at both sides of the thirteenth gate electrode G13.

The third region R3 including the skip contacts CAS1 and CAS2 may serve as a skip and/or jumper to overcome routing congestion in layout. For example, by virtue of the presence of the skip contacts CAS1 and CAS2, the second region R2 may be electrically separated from the fourth region R4. As such, the skip contacts CAS1 and CAS2 may serve as a skip and/or jumper. The PMOSFET regions PR in the second and fourth regions R2 and R4 may be separated from each other without use of any device isolation layer, due to the first skip contact CAS1. Similarly, the NMOSFET regions NR in the second and fourth regions R2 and R4 may be separated from each other without use of any device isolation layer, due to the second skip contact CAS2.

According to example embodiments of the inventive concept, it is possible to reduce an area of a semiconductor device including flip-flop circuits by about 10% and to improve performance or output of the semiconductor device, without increase of a cell height.

Figure 17:
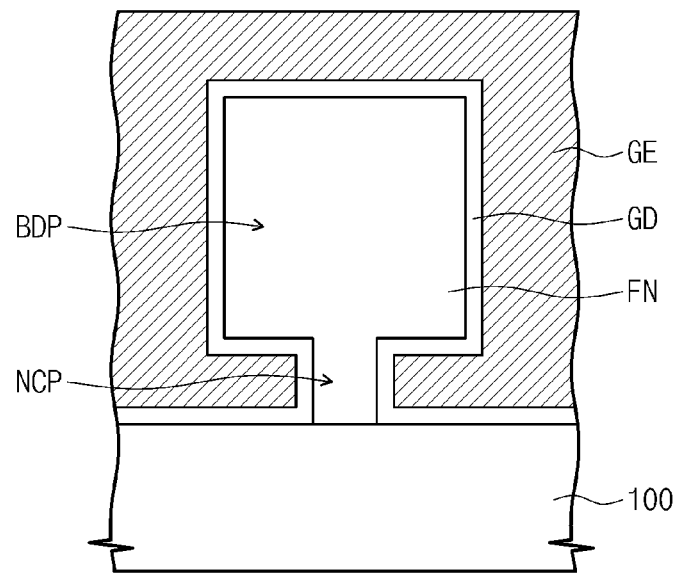
FIG. 17 is a sectional view schematically illustrating an active portion of a semiconductor device, according to other example embodiments of the inventive concept.

As described above, each of the active portions FN may have a fin-shaped structure, but the structure thereof may be variously changed. FIG. 17 is a sectional view schematically illustrating an active portion of a semiconductor device, according to other example embodiments of the inventive concept. In the embodiment of FIG. 17, the active portion FN may be configured to have an omega-shaped structure including a neck portion NCP adjacent to the substrate 100 and a body portion BDP wider than the neck portion NCP, when viewed in a vertical section. A gate insulating layer GD and a gate electrode GE may be provided to cover sequentially the active portion FN. The gate electrode GE may include a portion extending below the body portion BDP of the active portion FN.

Figure 18:
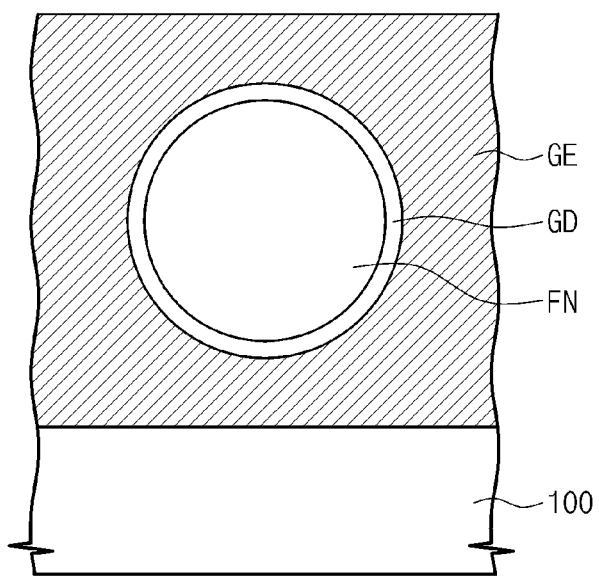
FIG. 18 is a sectional view schematically illustrating an active portion of a semiconductor device, according to still other example embodiments of the inventive concept.

FIG. 18 is a sectional view schematically illustrating an active portion of a semiconductor device, according to still other example embodiments of the inventive concept. In the embodiment of FIG. 18, the active portion FN may be provided in the form of a nanowire spaced apart from the substrate 100. A gate insulating layer GD and a gate electrode GE may be provided to cover sequentially the active portion FN. The gate electrode GE may include a portion interposed between the active portion FN and the substrate 100.

Figure 19:
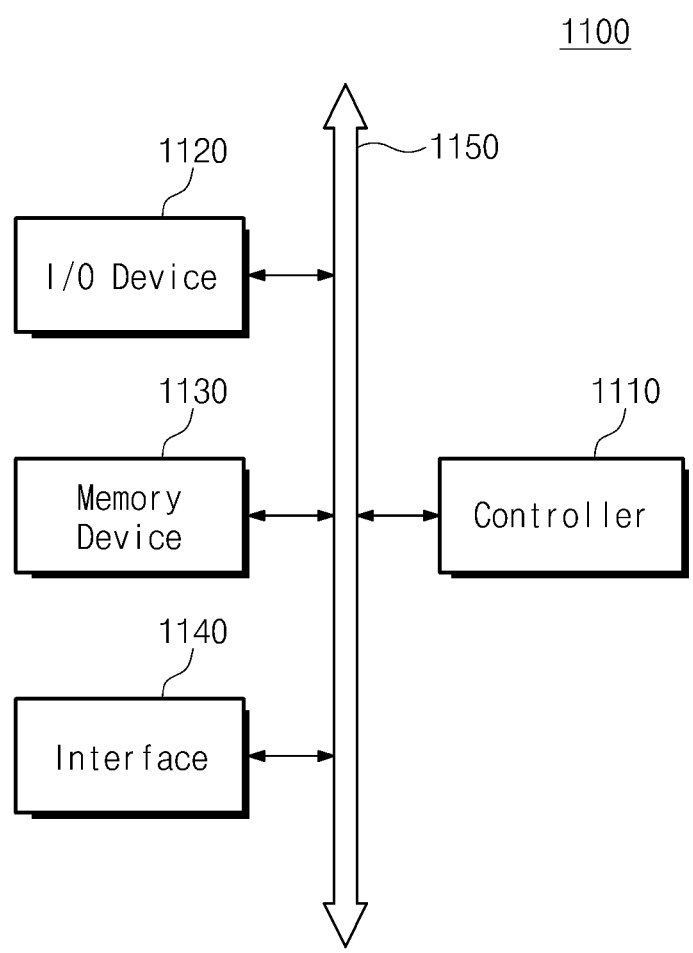
FIG. 19 is a schematic block diagram illustrating an example of electronic systems including a semiconductor device according to example embodiments of the inventive concept.

FIG. 19 is a schematic block diagram illustrating an example of electronic systems or electronic devices including a semiconductor device according to example embodiments of the inventive concept.

Referring to FIG. 19, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication. One or more of the controller 1110, input-output unit 1120, memory device 1130, and/or interface 1140 may be part of an electronic device that includes the features of one or more of the embodiments described above.

The controller 1110 may include, e.g., at least one of a microprocessor, a digital signal processor, a microcontroller, or another logic device. The other logic device may have a similar function to any one of the microprocessor, the digital signal processor, and the microcontroller. The input-output unit 1120 may include a keypad, keyboard, a display device, and so forth. The memory device 1130 may be configured to store data and/or command. The interface unit 1140 may transmit electrical data to a communication network or may receive electrical data from a communication network. The interface unit 1140 may operate by wireless or cable communication. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110. A semiconductor device according to example embodiments of the inventive concept may be provided, for example, as a part of the controller 1110 and/or the I/O unit 1120.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data by wireless communication.

According to example embodiments of the inventive concept, a semiconductor device may include a cross-coupled structure connecting two pairs of gate electrodes in a crossing manner. The cross-coupled structure allows the semiconductor device to have an increased integration density and a reduced cell height.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate including a PMOSFET region and an NMOSFET region;
   a first and a second gate electrode in the PMOSFET region;
   a third and a fourth gate electrode in the NMOSFET region;
   a connection contact connecting the second gate electrode and the third gate electrode, wherein the connection contact is electrically connected with upper surfaces of the second and third gate electrodes; and
   a connection line connecting the first gate electrode and the fourth gate electrode, the connection line crossing over the connection contact.

2. The semiconductor device of claim 1, wherein an extending line of the first gate electrode is aligned with the third gate electrode, and an extending line of the second gate electrode is aligned with the fourth gate electrode, when viewed in a plan view.

3. The semiconductor device of claim 1, further comprising a device isolation layer between the PMOSFET region and the NMOSFET region,
   wherein the connection line crosses over the connection contact on the device isolation layer.

4. The semiconductor device of claim 1, further comprising via-holes between the connection line and the first gate electrode and between the connection line and the fourth gate electrode, respectively.

5. The semiconductor device of claim 1, further comprising:
   a fifth gate electrode extending from the PMOSFET region to the NMOSFET region; and
   a gate contact in contact with an upper surface of the fifth gate electrode,
   wherein the gate contact comprises a portion crossing a sidewall of the fifth gate electrode, when viewed in a plan view.

6. The semiconductor device of claim 1, further comprising:
   a sixth gate electrode and a seventh gate electrode on the PMOSFET and NMOSFET regions, respectively;
   a first skip contact in contact with an upper surface of the sixth gate electrode; and
   a second skip contact in contact with an upper surface of the seventh gate electrode,
   wherein an extending line of the sixth gate electrode is aligned with the seventh gate electrode, when viewed in a plan view,
   the first skip contact is connected in common to source/drain regions provided at both sides, respectively, of the sixth gate electrode, and
   the second skip contact is connected in common to source/drain regions provided at both sides, respectively, of the seventh gate electrode.

7. The semiconductor device of claim 6, wherein the first and second skip contacts are connected to the source/drain regions through connection conductive patterns.

8. The semiconductor device of claim 1, further comprising:
   a fifth gate electrode extending from the PMOSFET region to the NMOSFET region, the fifth gate electrode crossing over the device isolation layer; and
   a gate contact in contact with an upper surface of the fifth gate electrode, the gate contact being over the device isolation layer.

9. A semiconductor device comprising a flip-flop circuit, wherein the flip-flop circuit comprises:
- first and fourth gate electrodes, which are provided on PMOSFET and NMOSFET regions of the semiconductor device, respectively, and to which a scan enable inversion signal is applied;
- second and third gate electrodes, which are provided on the PMOSFET and NMOSFET regions, respectively, and to which a scan enable signal is applied; and
- a first cross coupled structure connecting the second gate electrode to the third gate electrode and connecting the first gate electrode to the fourth gate electrode,
- wherein the first cross coupled structure comprises:
  - a first connection contact connecting the first gate electrode to the fourth gate electrode; and
  - a first connection line connecting the second gate electrode to the third gate electrode and crossing the first connection contact, the first connection line crossing over the first connection contact,
- wherein an extending line of the first gate electrode is aligned with the third gate electrode, and an extending line of the second gate electrode is aligned with the fourth gate electrode, when viewed in a plan view.

10. The semiconductor device of claim 9, further comprising:
- a fifth gate electrode extending from the PMOSFET region to the NMOSFET region; and
- a gate contact in contact with a top surface of the fifth gate electrode,
- wherein the gate contact comprises a portion crossing a sidewall of the fifth gate electrode, when viewed in a plan view.

11. The semiconductor device of claim 10, wherein the first connection contact and the gate contact are provided at substantially the same level from the substrate.

12. The semiconductor device of claim 10, further comprising power rails crossing the first to fifth gate electrodes, wherein the power rails and the first connection line are provided at substantially the same level from the substrate.

13. The semiconductor device of claim 9, further comprising a second cross coupled structure spaced apart from the first cross coupled structure.

14. The semiconductor device of claim 13, wherein the second cross coupled structure comprises:
- sixth and ninth gate electrodes, which are provided on the PMOSFET and NMOSFET regions, respectively, and to which a clock signal is applied;
- seventh and eighth gate electrodes, which are provided on the PMOSFET and NMOSFET regions, respectively, and to which a clock inversion signal is applied;
- a second connection contact connecting the sixth gate electrode to the ninth gate electrode; and
- a second connection line connecting the seventh gate electrode to the eighth gate electrode and crossing over the second connection contact,
- wherein an extending line of the sixth gate electrode is aligned with the eighth gate electrode, and an extending line of the seventh gate electrode is aligned with the ninth gate electrode, when viewed in a plan view.

15. The semiconductor device of claim 9, further comprising a device isolation layer between the PMOSFET and NMOSFET regions,
- wherein the first connection line crosses over the first connection contact on the device isolation layer.

16. A semiconductor device, comprising:
- a substrate including a PMOSFET region and an NMOSFET region;
- a first and a second gate electrode in the PMOSFET region;
- a third and a fourth gate electrode in the NMOSFET region;
- a device isolation layer between the PMOSFET and NMOSFET regions,
- a connection contact connecting the second gate electrode and the third gate electrode;
- a connection line connecting the first gate electrode and the fourth gate electrode, the connection line crossing over the connection contact on the device isolation layer;
- a fifth gate electrode extending from the PMOSFET region to the NMOSFET region, the fifth gate electrode crossing over the device isolation layer; and
- a gate contact in contact with an upper surface of the fifth gate electrode, the gate contact being over the device isolation layer.

17. The semiconductor device of claim 16, wherein the gate contact comprises a portion crossing a sidewall of the fifth gate electrode, when viewed in a plan view.

18. The semiconductor device of claim 16, wherein an extending line of the first gate electrode is aligned with the third gate electrode, and an extending line of the second gate electrode is aligned with the fourth gate electrode, when viewed in a plan view.

19. The semiconductor device of claim 16, further comprising via-holes between the connection line and the first gate electrode and between the connection line and the fourth gate electrode, respectively.

20. The semiconductor device of claim 16, further comprising:
- a sixth gate electrode and a seventh gate electrode on the PMOSFET and NMOSFET regions, respectively;
- a first skip contact in contact with an upper surface of the sixth gate electrode; and
- a second skip contact in contact with an upper surface of the seventh gate electrode,
- wherein an extending line of the sixth gate electrode is aligned with the seventh gate electrode, when viewed in a plan view.

* * * * *